United States Patent [19]

Suyama

[11] Patent Number: 4,656,611

[45] Date of Patent: Apr. 7, 1987

[54] LOGIC CIRCUIT

[75] Inventor: Katsuhiko Suyama, Yokohama, Japan

[73] Assignee: Fujitsu Limited, Kanagawa, Japan

[21] Appl. No.: 705,321

[22] Filed: Feb. 22, 1985

[30] Foreign Application Priority Data

Feb. 29, 1984 [JP] Japan .................................. 59-037460

[51] Int. Cl.$^4$ ................................................ G11C 7/00
[52] U.S. Cl. ...................................... 365/203; 365/190
[58] Field of Search ......................... 365/154, 190, 203

[56] References Cited

U.S. PATENT DOCUMENTS 4,122,548  10/1978  Heuber et al. ...................... 365/203
4,355,377  10/1982  Sud et al. ............................ 365/203

OTHER PUBLICATIONS

GaAs 1K Static RAM using Tungsten–Silicide Gate Self-Aligned Technology (p. 455, Fig. 12), by Naoki Yokoyama, Hiroyuki Onodera and Toyokazu Ohnishi, extracted from FUJITSU Scientific and Technical Journal, vol. 19, No. 4, (Dec. 15, 1983) printed in Japan.

Primary Examiner—Joseph A. Popek
Attorney, Agent, or Firm—Staas & Halsey

[57] ABSTRACT

A logic circuit includes a driver transistor and a load transistor formed by a junction type or Schottky barrier type field effect transistor, and an input terminal connected to a gate of the driving transistor. A gate voltage generator is connected to a gate of the load transistor and generates a level higher than the sum of threshold values of the load transistor and the driver transistor and lower than the lowest value of (1) the sum of a built-in voltage of the load transistor and the threshold voltage of the driver transistor and (2) the sum of a built-in voltage of the driver transistor and the threshold voltage of the load transistor.

15 Claims, 19 Drawing Figures

LOGIC CIRCUIT

BACKGROUND OF THE INVENTION

The present invention relates to a logic circuit, such as an inverter circuit, which is formed by a junction type or a Schottky barrier gate type field effect transistor (FET).

Recently, the use of integration circuits utilizing a gallium-arsenic (GaAs) substrate instead of a silicon (Si) semiconductor substrate has become wide-spread due to their rapid operation characteristic. However, the use of the GaAs substrate gives rise to several problems, for example, the manufacture of MOS type FET's is difficult, and thus the MOS FET's must be replaced by junction type or Schottky barrier gate type FET's. MOS FET's are widely used in the conventional Si substrate at present, because this enables an enhancement type FET to be easily manufactured.

Usually, depletion type and enhancement type FET's are used as load resistors in the inverter circuits widely used in logic circuits, but the enhancement type FET is more usually used as a driver transistor. However, the junction type FET can be transformed into an enhancement type FET (strictly speaking, the normally OFF type FET) by decreasing the total amount of impurities therein.

Some problems arise in the design and manufacture of the logic circuit using the junction type FET. For example: (1) it is necessary to strictly control the threshold voltage of the FET's ($\pm 0.01$ V), and (2) the logic amplitude cannot be increased, because a forward voltage larger than a built-in voltage (0.7 V in the GaAs Schottky type junction) cannot be applied to a gate junction. However, the use of the junction type FET has the advantages that (1) the logic amplitude is small and thus the electric power dissipation is low and the operation speed becomes high, and (2) an ultra high speed IC can be obtained by using a material other than Si for the semiconductor substrate.

However, as shown hereinafter in detail, in the inverter circuit formed by the junction type FET, the output level depends on an electric source voltage, and when the logic levels between an input and an output become adjusted, the electric source voltage cannot be increased. Therefore, a characteristic similar to that of the MOSFET cannot be obtained.

SUMMARY OF THE INVENTION

An object of the present invention is to provide a logic circuit formed by the junction type or Schottky barrier type gate FET's which will eliminate the above-mentioned drawbacks.

Another object of the present invention is to provide a logic circuit having a characteristic similar to that wherein a MOSFET is used by restricting the range of the gate voltage of the load FET.

Another object of the present invention is to provide a memory circuit having a bit line pull-up circuit which does not destroy a memory cell transistor.

The above-mentioned objects can be achieved by providing a logic circuit comprising a driver transistor and a load transistor formed by a junction type or Schottky barrier type FET, an input terminal connected to a gate of the driver transistor, and a gate voltage generator which is connected to a gate of the load transistor and which generates a level higher than the sum of the threshold values of the load transistor and the driver transistor and lower than the lowest value of (1) the sum of a built-in voltage of the load transistor and the threshold voltage of the driver transistor and (2) the sum of a built-in voltage of the driver transistor and the threshold voltage of the load transistor.

Further features and advantages of the present invention will be apparent from the ensuing description with reference to the accompanying drawings to which, however, the scope of the invention is in no way limited.

DETAILED DESCRIPTION OF THE INVENTION

Figure 1A:
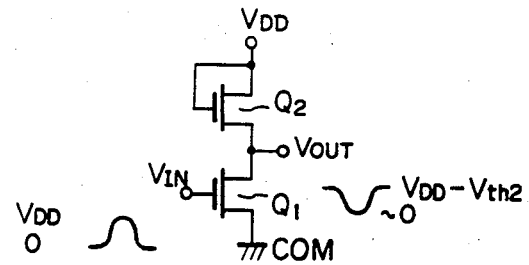
FIGS. 1A and 1B are circuit diagrams showing an example of the inverter circuit formed by a MOSFET and its characteristics.
Figure 1B:
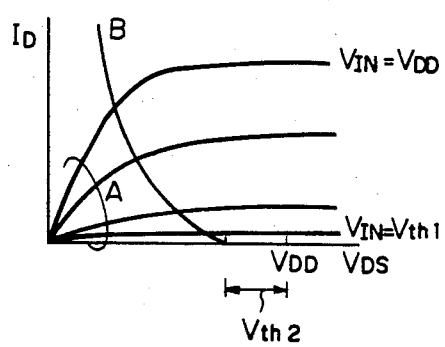

FIG. 1A shows a construction of an inverter circuit formed by a usual n channel MOSFET, in which $Q_1$ is a driver FET, $Q_2$ is a load FET, and all transistors are enhancement type. $V_{IN}$ is an input terminal, $V_{OUT}$ is an output terminal, $V_{DD}$ is an electric power source, and COM is a common ground. The load FET $Q_2$ is a MOS diode in which the gate and drain are connected together, and when $V_{DD}$ is higher than a specified value, the load FET $Q_2$ is placed in an ON state. In this circuit, a forward rising voltage varies due to the threshold voltage of the FET $Q_2$. In FIG. 1B, A shows a drain I-V characteristic curve of the FET $Q_1$, wherein the x axis shows a voltage $V_{DS}$ between a drain and a source, and the Y axis shows a drain current $I_D$; $Vth_1$ designates a threshold voltage of the FET $Q_1$; and B designates a load curve of the MOSFET $Q_2$. This V-I characteristic varies depending on the following equation (square characteristic):

$$I_L = \beta_2(V_{DD} - V_{OUT} - Vth_2)^2$$

Wherein $I_L$ is a load current, i.e., the current in FET $Q_2$, the output $V_{OUT}$ is determined by the cross-point of lines A and B, and a desired amplitude output is obtained by suitably selecting the threshold voltage $Vth_2$ of the load FET $Q_2$.

Figure 2A:
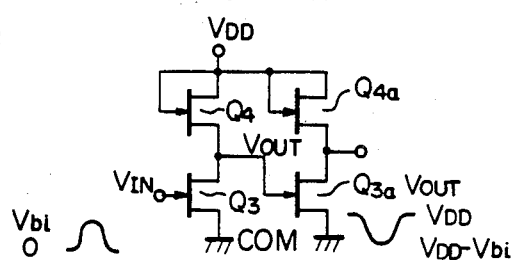
FIGS. 2A and 2B are diagrams showing an example of a conventional inverter circuit formed by a junction type FET and its characteristics.
Figure 2B:
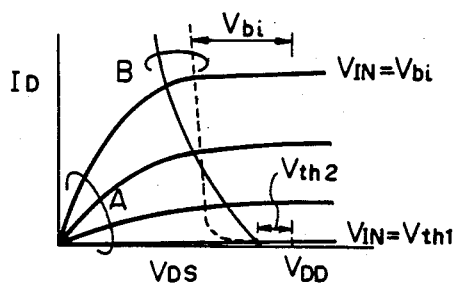

As shown in FIG. 2A, where a junction type FET is used in a circuit construction similar to that of FIG. 1A, the load FET $Q_4$ is operated as a simple diode, and the load characteristic does not change even if the threshold voltage of $FET_4$ is changed. That is, as shown in FIG. 2B, curve A shows the I-V characteristic curve of FET $Q_3$, and curve B shows a load line due to FET $Q_4$. The solid line of the load curve B shows the state where $V_{DD}-V_{OUT}<V_{bi}$ ($V_{bi}$ is a built-in voltage), and in this case, the gate current does not flow and the V-I characteristic varies, as for a MOSFET, depending on the following equation:

$$I_L = \beta_2(V_{DD}-V_{OUT}-Vth_2)^2$$

However, the dotted line of the load curve B shows the state where $V_{DD}-V_{OUT}>V_{bi}$, and in this case, a forward saturation current $I_L$ flows in a gate junction, as shown by the following equation:

$$I_L = I_S \exp\left\{ \frac{q}{kT} (V_{DD}-V_{OUT}) \right\}$$

That is, in the junction type FET, when $V_{DD}$ is low and the load curve is as shown by the solid line in FIG. 2B, the same amplitude can be obtained as from the inverter circuit formed by a MOSFET. However, when $V_{DD}$ becomes high and the load curve becomes as shown by the dotted line in FIG. 2B, the amplitude, that is, an output change, can be obtained. As shown in FIG. 2A, when the logic level of the input $V_{IN}$ is $0 \sim V_{bi}$, the logic level of the output $V_{OUT}$ depends on the electric source voltage $V_{DD}$ and is in the range of $(V_{DD}-V_{bi}) \sim V_{DD}$. Therefore, when the input and the output logic levels are set, it is necessary to set $V_{DD} \leq V_{bi}$ so that the level of $V_{DD}$ can be set at a high level.

Figure 3A:
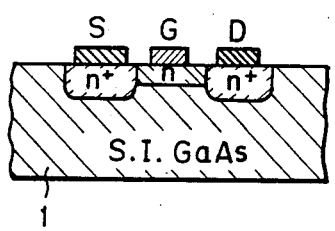
FIGS. 3A to 3F are diagrams explaining FET's.
Figure 3B:
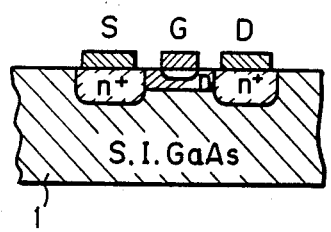
Figure 3C:
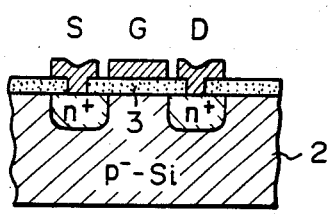
Figure 3D:
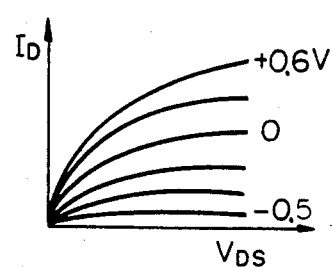
Figure 3E:
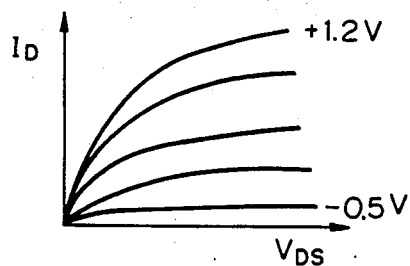
Figure 3F:
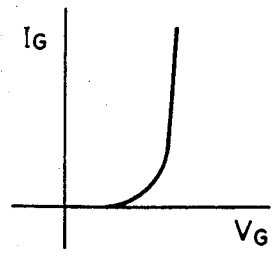

Next, elements of the constructions of FET's will be explained. FIGS. 3A to 3F are diagrams explaining these constructions. FIGS. 3A and 3B show Schottky barrier gate and junction type FET's (hereinafter called collectively junction type), and FIG. 3C shows a MOSFET. The substrate 1 of the junction type FET is formed by GaAs and is insulative, so that impurities are doped in the source, drain, and channel regions to effect conductivity, and a source electrode S and a drain electrode D are attached to the source and drain regions n+, n+, and a gate electrode G is attached to the channel region n. AuGe is used for the source electrode S and the drain electrode D, and WSi is used for the gate electrode G (see FIG. 3A). As in the conventional device, the substrate 2 of the MOSFET shown in FIG. 3C is made from Si, however, it differs in that a gate oxide film (SiO$_2$) 3 is sandwiched between the gate electrode G and the substrate 2. FIG. 3D shows a characteristic between the drain-source voltage $V_{DS}$ of the Schottky barrier type FET and the drain current $I_D$, and FIG. 3E shows a characteristic between the drain-source voltage $V_{DS}$ of the junction type FET and the drain current $I_D$. In FIGS. 3D and 3E, the gate voltage is used as the parameter. FIG. 3F shows the voltage current characteristic of the gate of the junction type FET, that when the gate voltage $V_G$ is raised higher than the predetermined voltage, a gate junction current flows. This is a characteristic of the diode.

Figure 4A:
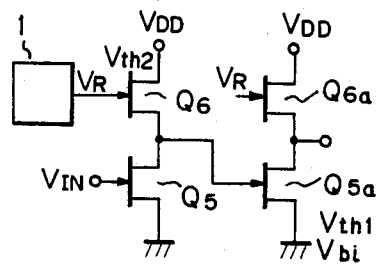
FIGS. 4A and 4B are diagrams showing the logic circuit of one embodiment of the present invention, and its characteristics.
Figure 4B:
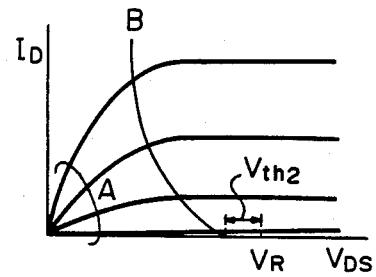

FIG. 4A is a circuit diagram of one embodiment of the present invention, wherein reference numeral 1 designates a gate voltage generator and transistors Q$_5$, Q$_6$ are normally OFF type junction FET's. When it is assumed that the constants of the driving FET Q$_5$ are $\beta_1$, Vth$_1$, the constants of FET Q$_6$ are $\beta_2$, Vth$_2$, and the gate voltage of FET Q$_6$ is $V_R$ which is provided from the gate voltage generator 1, accordingly, the load characteristic becomes as shown in FIG. 4B. That is, the I-V characteristic of the FET is $I_D=\beta(V_{GS}-Vth)^2$ in the current saturation region, and when two FETs Q$_5$, Q$_6$ are operated in the current saturation region, the following equation stands.

$$\beta_1(V_{IN}-Vth_1)^2 = \beta_2(V_R-V_{OUT}-Vth_2)^2 \quad (1)$$

Thus, from the equation (1), in the range of $V_{IN} \geq Vth_1$ and $V_{OUT} \leq V_R - Vth_2$, $$V_{out} = V_R - Vth_2 - \sqrt{\frac{\beta_1}{\beta_2}} (V_{IN} - Vth_1) \quad (2)$$

and the output $V_{OUT}$ becomes maximum when $V_{IN}=Vth_1$.

$$V_{out}(max) = V_R - Vth_2 \quad (3)$$

Therefore, from the following equation (3), it can be seen that the maximum value $V_{out}$(max) of the output voltage can be controlled by the gate voltage $V_R$.

When the inverter circuit formed by the FET's Q$_5$ and Q$_6$ is connected to a next stage inverter formed by FET's Q$_{5a}$ and Q$_{6a}$, the following relationships are required.

| $V_{IN}$ | $V_{out}$ | Requirement |
|---|---|---|
| Low (L) level | H level | Vth$_1$ < $V_R$ − Vth$_2$ = $V_H$ ≦ $V_{bi}$ For making Q$_{5a}$ ON |
| High (H) level | L level | $V_R$ − $V_{bi}$ ≦ $V_L$ ≦ Vth$_1$ For making Q$_{5a}$ OFF |

In the above relationship, $V_{bi}$ designates a built-in voltage of the next stage transistor Q$_{5a}$. That is, the H level of the output voltage should be equal or lower than the $V_{bi}$ of the transistor Q$_{5a}$ so that there is no gate current of the transistor Q$_{5a}$. Therefore, $V_{out}$(max)≦$V_{bi}$, when combined with equation (3), yields $$V_R \leq V_{bi} + Vth_2 \quad (4)$$

On the other hand, the minimum value of the high level output voltage (that is, the voltage for making the next stage transistor Q$_{5a}$ be off) is Vth$_1$, and it is set as $$V_R > Vth_1 + Vth_2 \quad (5)$$

Therefore, from equations (4) and (5), $$Vth_1 + Vth_2 < V_R \leq V_{bi} + Vth_2 \quad (6)$$

That is, when the value of $V_R$ is set in the above-mentioned range, the load characteristic shown in FIG. 4B becomes the same as that of the MOSFET. Furthermore, the transistor Q$_{5a}$ would not be destroyed by the gate current.

That is, in the circuit shown in FIG. 4A, when the input voltage $V_{IN}$ is decreased to near Vth$_1$, the drain current of FET Q$_5$ is decreased and the output voltage thereof rises. Then, when the output voltage $V_{out}$ increases to $V_R-Vth_2$, the load FET Q$_6$ is made OFF, and the output voltage does not change thereafter. This voltage depends on the voltage $V_R$, as shown in equation (3). When the value $V_R$ is set to $V_R>V_{bi}+Vth_2$, the $V_{out}$ becomes higher than the value $V_{bi}$. However, when the input of the next inverter formed by the FET's Q$_{5a}$ and Q$_{6a}$ is connected, and set to $V_{out}>V_{bi}$, the current flows in the next stage via the gate junction or barrier of the FET $Q_{5a}$, and thus the output voltage $V_{out}$ decreases. If this current is large, the gate of the next stage transistor $Q_{5a}$ is melted, thus, in the present invention, the output voltage $V_{out}$ is prevented from becoming larger than the built-in voltage $V_{bi}$.

Regarding the low level of the output voltage, the low level of $V_{out}$ is clamped at the level $V_R - V_{bi}$, because if the $V_{out}$ becomes lower than $V_R - V_{bi}$, the gate junction or barrier of the load FET $Q_6$ turns on. And also, the low level of $V_{out}$ should be lower than $Vth_1$ of $Q_{5a}$. Therefore, $V_R - V_{bi} \leq V_L \leq Vth_1$.

That is, $$V_R \leq V_{bi} + Vth_1 \tag{7}$$

Combination of (6) and (7) yields $$Vth_1 + Vth_2 < V_R \leq (V_{bi} + Vth_2)$$

or $$(V_{bi} + Vth_1) \tag{8}$$

If $Vth_1 > Vth_2$ or $Vth_1 = Vth_2$, (8) should be $Vth_1 + Vth_2 < V_R \leq V_{bi} + Vth_2$.

Figure 5:
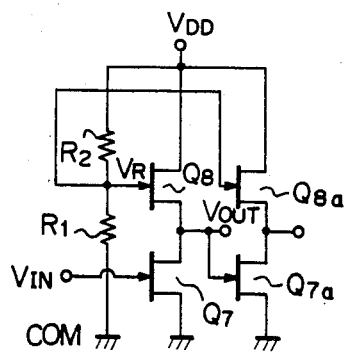
FIGS. 5, 6, and 7 are concrete examples of the circuits of the present invention.
Figure 6:
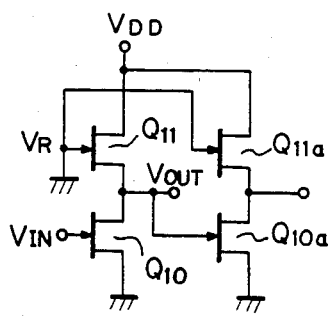

FIGS. 5 and 6 show concrete examples of the gate voltage generator 1 shown in FIG. 4A. In FIG. 5, the transistor $Q_7$ is a driver FET and $Q_8$ is a load transistor and $Q_{7a}$, $Q_{8a}$ are the next stage FET's. Here, the gate voltage $V_R$ is formed by dividing the electric source voltage by resistors $R_1$ and $R_2$, all the transistors are GaAs MESFET's, and $Vth = +0.1$ V. When it is assumed that the value $V_{bi}$ of the Schottky type transistor is $+0.7$ V, $V_{DD} = +2$ V, the values of the resistors are $R_1 = 8$ kΩ, $R_2 = 12$ kΩ, and the gate voltage $V_R$ becomes $V_R = 0.8$ V. Under this operation condition, when the input voltage $V_{IN}$ is 0.1 volt, the output voltage $V_{out}$ becomes 0.7 volt, and when the input voltage $V_{IN}$ is 0.7 volt, the output voltage $V_{out}$ becomes 0.1 volt.

In FIG. 6, $Q_{10}$ is a driver FET, $Q_{11}$ is a load FET, and $Q_{10a}$ and $Q_{11a}$ form the next stage inverter. In FIG. 6, the drive FET $Q_{10}$ is an enhancement type having $Vth = 0.1$ V, the load FET $Q_{11}$ is a depletion type FET having $Vth = -0.7$ V, and both are GaAs MESFET's as in FIG. 5. The built-in voltage thereof is $+0.7$ volt. In FIG. 6, the gate voltage $V_R$ of the load FET $Q_{11}$ is connected to a common terminal when $V_{DD} = +2$ V, this also satisfies the equation (4). That is, when $V_{IN}$ is 0.1 V, $V_{out}$ becomes 0.7 V, and when $V_{IN}$ is 0.7 V, $V_{out}$ becomes 0 V, so that the gate of the load FET is not conductive, and a characteristic similar to that of FIG. 5 can be obtained.

Figure 7:
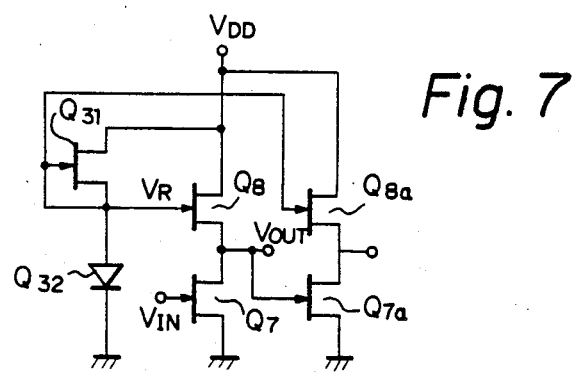

FIG. 7 is a modification of the embodiment of FIG. 5, in which the load gate voltage $V_R$ is generated by a constant current source using a depletion type FET $Q_{31}$ and a diode $Q_{32}$ (forward built-in voltage $V_{bi}$) formed by shorting between a drain and a source of the junction type FET. In FIG. 7, since the value $V_R$ can be equal to $V_{bi}$, when the load FET is a normally OFF type ($Vth_2 \geq 0$), the equation (4) can be satisfied. The gate voltage $V_R$ generated by using the diode as shown in FIG. 7 has a greater precision than that generated by using the resistor as shown in FIG. 5.

Figure 8A:
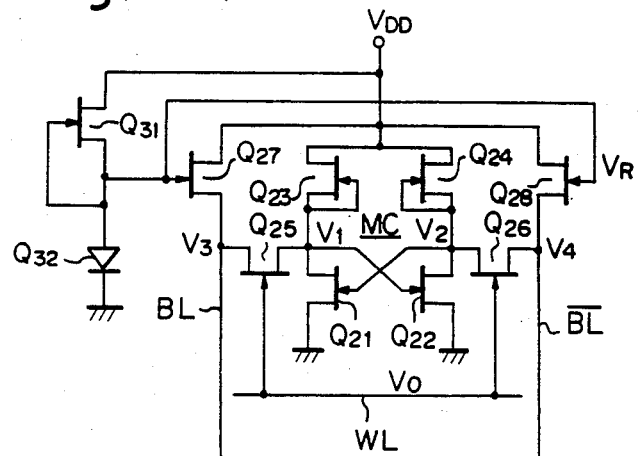
FIGS. 8A and 8B are diagrams showing one embodiment wherein the present invention is applied to the bit line pull up circuit of the memory cell, and its characteristics.

FIG. 8A shows an embodiment of the present invention when applied to a bit line pull up circuit in a static memory, wherein BL, $\overline{BL}$ are bit lines, and WL is a word line. In a memory cell MC, $Q_{21}$ and $Q_{22}$ are driver FET's, $Q_{23}$ and $Q_{24}$ are internal load FET's for forming a flip-flop circuit together with the drivers $Q_{21}$ and $Q_{22}$, $Q_{25}$ and $Q_{26}$ are transfer FET's, and $Q_{27}$ and $Q_{28}$ are bit line pull up FET's. Therefore, pairs of transistors $Q_{27}$ and $Q_{21}$, and $Q_{28}$ and $Q_{22}$ form the inverter circuit as shown in FIG. 4A. The internal load FET's $Q_{23}$, $Q_{24}$ are depletion type wherein $Vth = -0.7$ V, and the other FET's are enhancement type wherein $Vth = +0.1$ V. The gates are all 1 μm in length, the gate width of $Q_{21}$, $Q_{22}$, $Q_{25}$, and $Q_{26}$ is 10 μm, the gate width of $Q_{23}$, and $Q_{24}$ is 2 μm, and the gate width of $Q_{27}$ and $Q_{28}$ is 20 μm. The circuit shown in FIG. 7 is used as the gate voltage generator. Further, in FIG. 8A, FET's $Q_{35}$ and $Q_{36}$ are sense amplifiers, and the FET $Q_{37}$ is provided for selecting the bit lines BL, $\overline{BL}$.

In the circuit shown in FIG. 8A, if it is assumed that FET $Q_{21}$ is ON and FET $Q_{22}$ is OFF, therefore, $$V_1 = 0 \text{ V and } V_2 = +V_{bi}$$

At this time, as the FET $Q_{22}$ is OFF, the current in the load FET $Q_{24}$ flows into the gate of the FET $Q_{21}$. Then, to prevent the gate of the FET $Q_{21}$ from melting and disturbing normal operation of the FET $Q_{21}$, the current value is designed based on the saturation drain current of the FET's $Q_{23}$, and $Q_{24}$. The word line WL is placed at a high level, the transfer FETs $Q_{25}$, $Q_{26}$ become ON, the current flows via a path $Q_{27} \rightarrow Q_{25} \rightarrow Q_{21}$, and the voltage $V_3$ in the bit line BL falls to $V_1 = 0$ V. At this time, the voltage $V_4$ in another bit line $\overline{BL}$ approaches $V_2 = +V_{bi}$. Therefore, when this voltage $V_4$ in the bit line $\overline{BL}$ is precharged near $V_{bi}$, this transient response can be neglected. This can be achieved by setting the voltage $V_R$ so as to satisfy the equation (6), (7). That is, before turning on the transfer gate $Q_{26}$, the bit line $\overline{BL}$ level $V_4$ is lower than $V_{bi}$ of $Q_{21}$ according to the equation (6). Therefore, the $V_4$ level is lower than $V_2$ so that, after turning on the transfer gate $Q_{26}$, there is no big current from the bit line $\overline{BL}$ to the gate of the transistor $Q_{21}$, and consequently there is no destruction of $Q_{21}$.

As an example infringing upon equation (6), the circuit is constructed in which the gate and drain of the FET $Q_{27}$, $Q_{28}$ are connected (which corresponds to $V_R = V_{DD}$). In this case, the voltage $V_3$ falls only to $V_{DD} - V_{bi}$, and a potential difference exists between $V_3$ and $V_1$, whereby the current flows into the memory cell via the FET. If this current becomes larger than a specified value, the state of the memory cell is inverted. Further, when the voltage $V_4$ rises to $V_{DD}$, the current flows via the FET $Q_{26}$ into the memory cell. This current flows from the gate to the source of the FET $Q_{21}$, and may melt the gate of the FET. However, this can be prevented by ensuring that the voltage $V_R$ satisfies the equation (4).

Figure 9A:
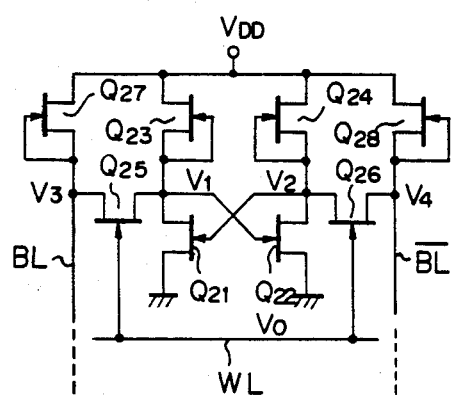
FIGS. 9A and 9B are diagrams showing the conventional bit line pull up circuit, and its characteristics.

FIG. 9A is the conventional circuit using depletion type FET's in which the gate and the source of the FET's $Q_{27}$, $Q_{28}$ are connected. In this case, the voltage $V_3$ in the bit line BL falls near $V_1 = 0$ and the voltage $V_4$ in the bit line $\overline{BL}$ rises to $V_{DD}$. Usually, when a depletion transistor is used as the load, the amplitude of the output voltage can be increased. However, in the bit line of the memory cell, the stray capacitance of the bit line is larger, therefore, when the amplitude voltage is increased, the switching speed is decreased because of the length of the charge and the discharge time. To increase the switching speed, the amplitude must be set as small as possible. In the circuit shown in FIG. 8A according to the present invention, this value of the amplitude can be set lower than $V_{bi}$. The built-in voltage $V_{bi}$ is determined by the construction and the material of the gate junction of the FET, and has a good reproducibility. When the load gate voltage $V_R$ is decreased, the amplitude becomes further decreased, and a higher speed operation can be obtained.

In the example shown in FIG. 9A, FET's $Q_{23}$, $Q_{24}$, $Q_{27}$, $Q_{28}$ are depletion type, wherein Vth= −0.7 V. The other transistors are enhancement type wherein Vth= +0.1 V. All the FET's have a gate length of 1 μm, with the gate widths of $Q_{21}$, $Q_{22}$, $Q_{25}$, and $Q_{26}$ being 10 μm, and the gate widths of $Q_{23}$, $Q_{24}$, $Q_{27}$, and $Q_{28}$ being 2 μm.

Figure 9B:
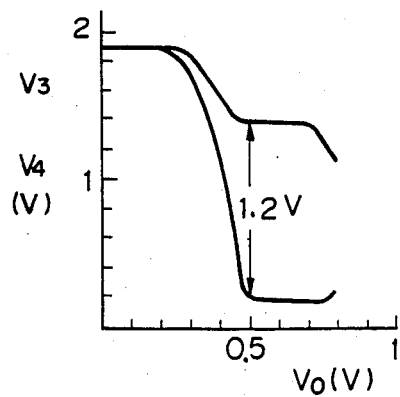

In the conventional example shown in FIG. 9A, when it is assumed that $V_{DD}$ is 2 V, the Vth of the FET's $Q_{27}$ and $Q_{28}$ is −0.7 V, the gate width of $Q_{27}$ and $Q_{28}$ is 2 μm, the voltage amplitude of the bit lines BL, $\overline{BL}$ is 1.8 V, the voltage amplitude between the bit lines BL, $\overline{BL}$ is 1.2 V, and the delay time for passage of the signal from the word line to the bit line (where the bit line capacitance is assumed to be 0.5 pF) is 2 ns, then the relationship between the word line voltage $V_0$ and the bit line voltages $V_3$, $V_4$ is as shown in FIG. 9B (by simulation). As is clear from FIG. 9B, the potential difference between the bit lines becomes 1.2 V at maximum. However, when the bit line capacitance is large, the response characteristic for driving by the cell driver FET's $Q_{21}$, $Q_{22}$ deteriorates. Therefore, if the noise margin is considered, in practice, this value of 1.2 V is an excess potential difference.

Figure 8B:
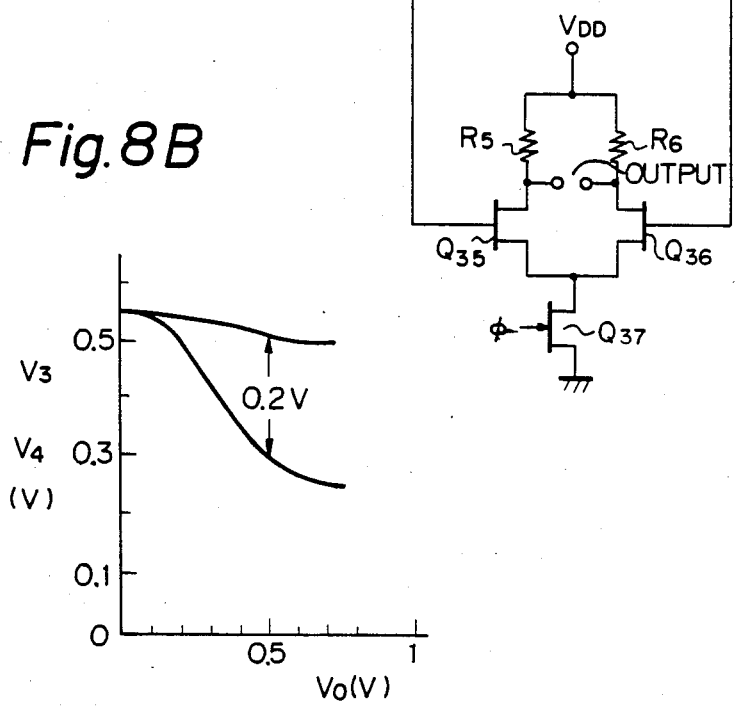

On the other hand, in the circuit shown in FIG. 8A of the present invention, when it is assumed that $V_{DD}$ is 2 V, the Vth of FET's $Q_{27}$, $Q_{28}$ is +0.1 V, the gate width of $Q_{27}$, $Q_{28}$ is 20 μm, the voltage amplitude of the bit lines is 0.3 V, voltage amplitude between the bit lines is 0.2 V, and the delay time for passage of the signal from the load line to the bit line (where the bit line capacitance is assumed to be 0.5 pF) is 0.7 nS, then the relationship between the word line voltage $V_0$ and the bit line voltages $V_3$, $V_4$ is as shown in FIG. 8B (by simulation). As is clear from FIG. 8B, the difference between the bit lines is in the order of 0.2 V, that is, it is only one-sixth of that shown in FIG. 9B. Because this output amplitude is small, however, a sufficient noise margin is allowable, and the operation speed becomes high, i.e., a three-fold increase when compared to the case shown in FIG. 9B.

As mentioned above, according to the present invention, the inverter circuit having an E—E construction due to inclusion of the junction type FET can be operated in the same manner as the inverter circuit using a MOSFET, and high speed operation can be obtained because of the small output amplitude. Further, the amplitude of the output voltage is made smaller than the built-in voltage of the gate junction, and thus there is no danger of it flowing the gate current into the next stage junction type FET, and therefore, it is very effective for the realization of a high speed IC using a GaAs semiconductor substrate.

I claim:

1. A logic circuit comprising a series circuit of a driver transistor and a load transistor, each formed by a junction type field effect transistor to have a respective threshold voltage and built-in voltage, an input terminal connected to a gate of said driver transistor, and a gate voltage generator which is connected to a gate of said load transistor and which provides a gate voltage to said gate of said load transistor that is higher than the sum of the threshold values of said load transistor and said driver transistor, and lower than the lowest one of (1) the sum of the built-in voltage of said load transistor and the threshold voltage of said driver transistor and (2) the sum of the built-in voltage of said driver transistor and the threshold voltage of said load transistor.

2. A logic circuit comprising:
a first inverter and a second inverter connected in two successive stages, said first inverter and said second inverter each comprising a respective driver transistor and a load transistor connected at a respective connection point, each said load and driver transistor being formed by a junction type field effect transistor so that said load transitors have a first threshold voltage value and a first built-in voltage value, and said driver transistors have a second threshold voltage value and a second built-in voltage value, an input terminal connected to a gate of said driver transistor of said first inverter, said connection point of said first stage being operatively connected to the gate of said driver transistor of said second inverter, and said connection point of said second inverter providing an output; and
a gate voltage generator which is connected to a gate of each said load transistor and which generates a gate voltage therefor at a level that is higher than the sum of said threshold voltage value of said load transistors and said threshold voltage value of said driver transistors, and lower than the lower of (1) the sum of said built-in voltage value of said load transistors and said threshold voltage value of said driver transistors and of (2) the sum of said built-in voltage value of said driver transistors and said threshold voltage value of said load transistors, wherein gate current in said driver transistor of said second stage is prevented.

3. A logic circuit according to claim 1 or 2, wherein said gate voltage generator is formed by dividing an electric source voltage using two resistors.

4. A logic circuit according to claim 1 or 2, wherein said gate voltage generator is formed by connecting said gate of each said load transistor to a common terminal.

5. A logic circuit according to claim 1 or 2, wherein said gate voltage generator comprises a series circuit of a constant current electric source connected to an electric source voltage and a diode connected between said constant current electric source and a common terminal, and the connecting point between said constant electric source and said diode is connected to said gates of each said load transistor.

6. A logic circuit according to claim 5, wherein said constant current source is formed by a depletion type field effect transistor the gate and source of which are connected, and said diode is formed by a junction type field effect transistor the drain and source of which are short circuited.

7. A bit line pull up circuit of a memory circuit comprising:
bit lines and word lines;
memory cells provided at the cross points of the bit lines and word lines;
each said memory cell having a first and a second field effect transistor of the junction type, each having a threshold value and a built-in voltage value, said first and second field effect transistors of each said memory cell having their sources operatively connected to a common terminal, and the gates and drains thereof being cross connected to each other, first and second loads respectively connected between the drains of said first and second driver field effect transistors and an electric source voltage, first and second transfer field effect transistors resepectively connected between the drains of said first and second driver transistors and said bit lines and having their gates connected to a respective one of said word lines;

first and second bit line pull up transistors connected between respective ends of said bit lines and an electric source and having a respective voltage value and a respective built-in voltage value; and a gate voltage generator which is connected to the gates of said first and second bit line pull up transistors and which generates a gate voltage therefor at a level that is higher than the sum of said threshold voltage value of said bit line pull up transistors and said threshold voltage value of said drive transistors of the memory cell, and lower than the lower of (1) the sum of said built-in voltage value of said bit line pull up transistors and said threshold voltage value of said driver transistors and of (2) the sum of said built-in voltage value of said dirver transistors and said threshold voltage value of said bit line pull up transistors.

8. The circuit of claim 1, 2 or 7, each said junction type field effect transistor being a Schottky barrier type field effect transistor.

9. The circuit of claim 1, 2, or 7, comprising each said junction type field effect transistor being formed of doped regions in a semiconductor substrate, and a gate electrode formed on said substrate.

10. The circuit of claim 1, wherein gate current is prevented from flowing in the gate of said load transistor.

11. The circuit of claim 2, wherein a load line of said load transistor of said second inverter is constant.

12. The circuit of claim 7, wherein each said transistor is of the enhancement type.

13. The circuit of claim 7, wherein the difference in voltage between the bit lines of each said memory cell, after operation of said first and second bit line pull up transistors, is on the order of 0.2 V.

14. The circuit of claim 7, each said first and second load comprising a junction type field effect transistor of the depletion type.

15. The circuit of claim 14, each said junction type field effect transistor of said first and second loads having its gate connected to its drain.

* * * * *

UNITED STATES PATENT AND TRADEMARK OFFICE
CERTIFICATE OF CORRECTION

PATENT NO. : 4,656,611
DATED : April 7, 1987
INVENTOR(S) : Katsuhiko Suyama

It is certified that error appears in the above-identified patent and that said Letters Patent is hereby corrected as shown below:

On the title page assignee should read

--(73)Assignee: Fujitsu Limited, Kawasaki, Japan --.

Signed and Sealed this

First Day of September, 1987

Attest:

DONALD J. QUIGG

*Attesting Officer*  *Commissioner of Patents and Trademarks*